(12) United States Patent
Orlowski et al.

(10) Patent No.: US 7,205,202 B2
(45) Date of Patent: Apr. 17, 2007

(54) SEMICONDUCTOR DEVICE AND METHOD FOR REGIONAL STRESS CONTROL

(75) Inventors: Marius K. Orlowski, Austin, TX (US); Vance H. Adams, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/111,450

(22) Filed: Apr. 21, 2005

(65) Prior Publication Data

US 2006/0240609 A1    Oct. 26, 2006

(51) Int. Cl.
*H01L 21/331*    (2006.01)
(52) U.S. Cl. .................... 438/370; 438/519
(58) Field of Classification Search .......... 438/370, 438/519
See application file for complete search history.

(56) References Cited

U.S. PATENT DOCUMENTS

| | | | | |
|---|---|---|---|---|
| 5,315,144 A | * | 5/1994 | Cherne | 257/351 |
| 5,374,564 A | | 12/1994 | Bruel | |
| 5,702,957 A | * | 12/1997 | Padmanabhan | 348/262 |
| 6,503,783 B1 | * | 1/2003 | Mouli | 438/154 |
| 6,756,285 B1 | | 6/2004 | Moriceau et al. | |
| 2004/0142537 A1 | | 7/2004 | Lee et al. | |
| 2004/0166649 A1 | | 8/2004 | Bressot | |
| 2004/0173812 A1 | | 9/2004 | Currie et al. | |
| 2005/0029601 A1 | | 2/2005 | Chen et al. | |

OTHER PUBLICATIONS

Huang, "Mechanics of Relaxing SiGe Islands on a Viscous Glass", Acta Mechinica Sinica, Jul. 2001, Xian, China.
Yin, "Relaxed SiGe Layers with High Ge Content by Compliant Substrates", Center for Photonics and Optoelectronic Materials and Department of Electrical Engineering, Princeton University, Princeton, NJ.
Carlotti, "Measurement of the elastic and viscoelastic properties of dielectric films used in microelectronics", Elsevier Science B. V., 2002, Italy.

* cited by examiner

*Primary Examiner*—Dung A. Le
(74) *Attorney, Agent, or Firm*—Susan C. Hill; Robert L. King

(57) ABSTRACT

Mechanical stress control may be achieved using materials having selected elastic moduli. These materials may be selectively formed by implantation, may be provided as a plurality of buried layers interposed between the substrate and the active area, and may be formed by replacing selected portions of one or more buried layers. Any one or more of these methods may be used in combination. Mechanical stress control may be useful in the channel region of a semiconductor device to maximize its performance. In addition, these same techniques and structures may be used for other purposes besides mechanical stress control.

18 Claims, 5 Drawing Sheets

SEMICONDUCTOR DEVICE AND METHOD FOR REGIONAL STRESS CONTROL

RELATED APPLICATION

This is related to United States Patent Docket Number SC13973TP filed concurrently herewith, entitled "Semiconductor Device Having a Plurality of Different Layers and Method thereof", and assigned to the current assignee hereof.

FIELD OF THE INVENTION

The present invention relates to semiconductor devices, and more particularly, to a plurality of different layers in a semiconductor device.

RELATED ART

Mechanical stress within a semiconductor device can affect the semiconductor device's performance. It is thus useful to be able to control the mechanical stress levels in a semiconductor device in such a way that the desirable properties of the device are enhanced while the undesirable properties are reduced.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
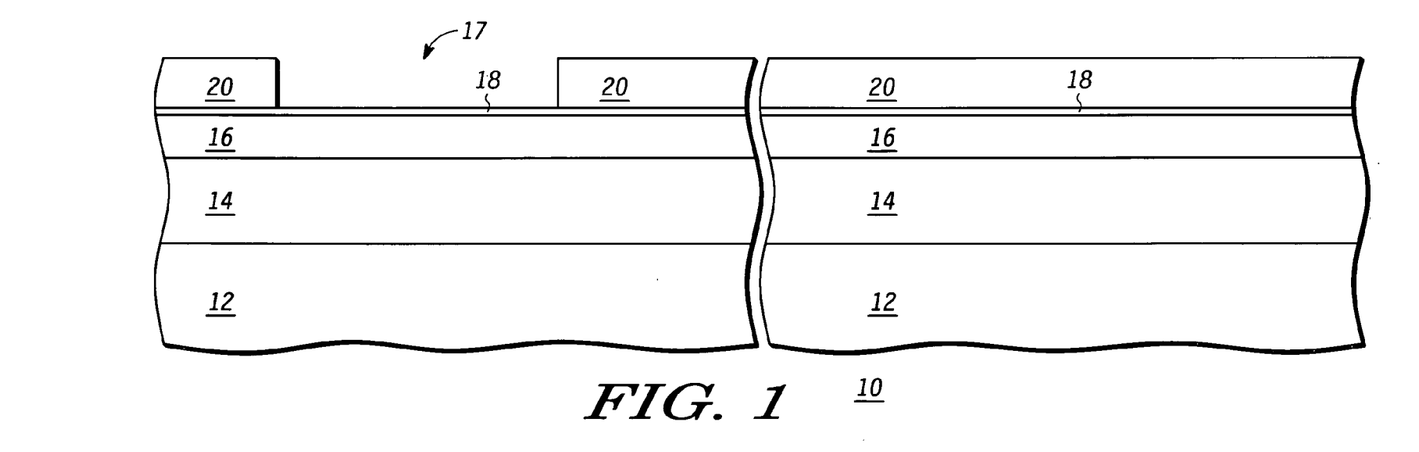
FIGS. 1–5 of the drawings illustrate a series of partial cross-sectional views of a semiconductor device during various stages of manufacture of an integrated circuit according to one embodiment of the present invention.

FIG. 1 illustrates a semiconductor device 10 having a substrate 12, an overlying buried dielectric 14, an overlying mono-crystalline semiconductor layer 16, and an overlying dielectric layer 18. A mask layer 20 is selectively patterned to have an opening 17. In one embodiment, substrate 12 comprises one or more of mono-crystalline silicon, sapphire, silicon oxide, polysilicon, or any appropriate material with sufficient structural strength to support the overlying layers. In one embodiment, dielectric layer 14 comprises one or more of silicon dioxide, silicon nitride, silicon oxynitride ($SiO_xN_y$), or any appropriate dielectric material. In one embodiment, mono-crystalline semiconductor layer 16 comprises one or more of silicon, silicon germanium, silicon carbon, silicon germanium carbon, in various states of mechanical stress. In one embodiment, dielectric layer 18 comprises one or more of silicon dioxide, silicon nitride, silicon oxynitride, hafnium oxide, zirconium oxide, hafnium zirconium oxide, or any appropriate dielectric material having a high dielectric constant (K). In some embodiments, dielectric layer 18 may be a sacrificial layer which is removed during further processing. Mask 20 may be any appropriate masking material, such as, for example, silicon nitride, silicon dioxide, photoresist, etc. One or more openings 17 are formed in masking layer 20 over desired regions of device 10.

Figure 2:
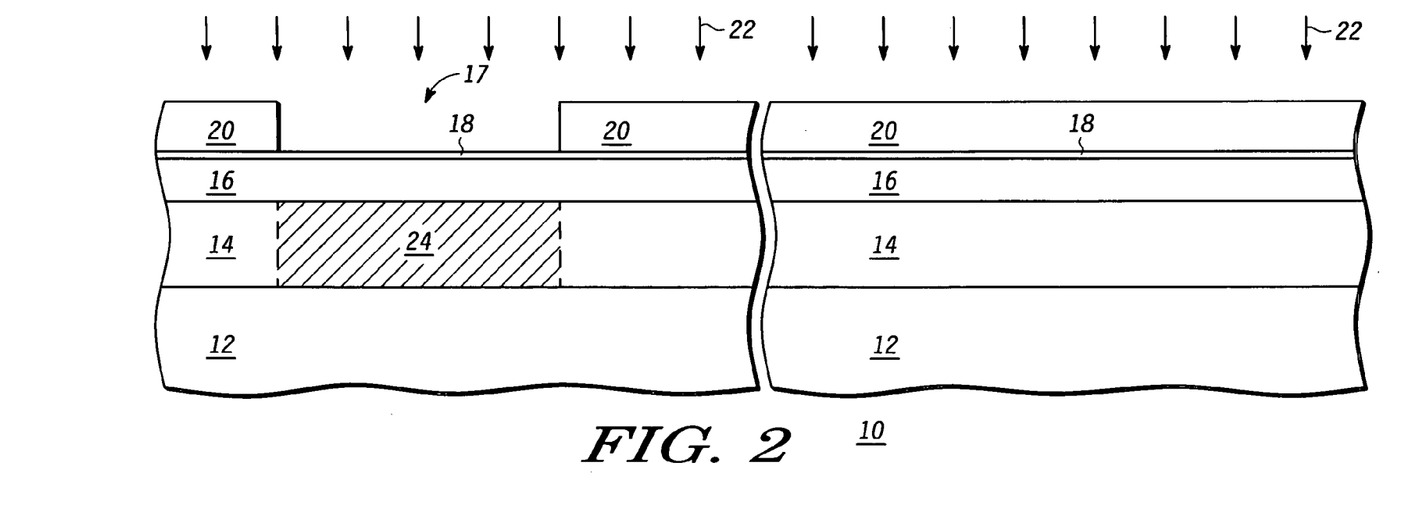

FIG. 2 illustrates an ion implantation process 22 performed on the device 10 of FIG. 1. Mask 20 inhibits ion implantation in all masked areas, except for areas underlying opening 17. The ion implantation energy can be chosen so that the implanted ions are implanted in implanted region 24. In one embodiment, the implanted ions cause region 24 to have a reduced elastic modulus relative to the elastic modulus of the non-implanted dielectric material 14. In one embodiment, the implanted ions comprise one or more of boron, phosphorus, or any other appropriate material which reduces the elastic modulus of region 24 relative to the elastic modulus of the non-implanted dielectric material 14.

In one embodiment, for ion implant 22, the implant species concentration of boron is in the range of 1E19 to 5E22 atoms per cubic centimeter. Alternate embodiments may use an implant species concentration of boron in the range of 1E20 to 5E21 atoms per cubic centimeter. In one embodiment, for ion implant 22, the implant species concentration of phosphorus is in the range of 1E19 to 5E22 atoms per cubic centimeter. Alternate embodiments may use an implant species concentration of phosphorus in the range of 1E20 to 5E21 atoms per cubic centimeter. If both boron and phosphorus are used together for ion implant 22, their respective concentrations may remain in these same ranges. If both boron and phosphorus are used together or separately for ion implant 22, a subsequent anneal process may be used to cause the implanted dielectric in region 24 to form one type of silicated glass, namely boron silicate glass (BSG) or phosphorus silicate glass (PSG) or boron-phosphorus silicate glass (BPSG). The anneal process may performed at temperatures in the range of 500–1175 degrees Celsius for 10 minutes to 2 hours, or alternately at temperatures in the range of 700–1150 degrees Celsius for 10 minutes to 1 hour. In general, a longer time is required for the anneal process when a lower temperature is used.

Figure 3:
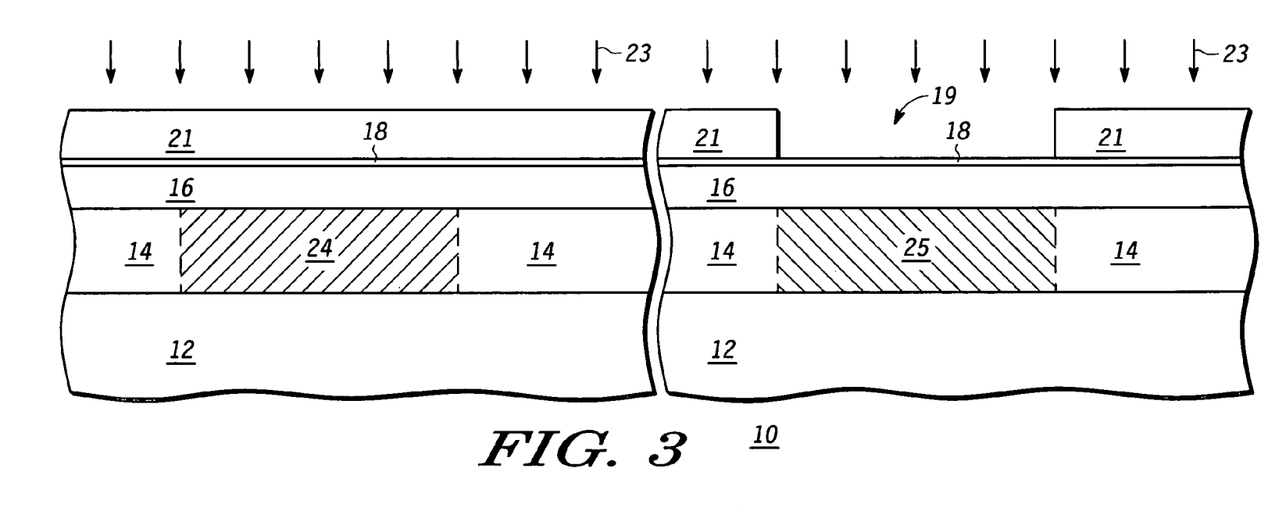

FIG. 3 illustrates an ion implantation process 23 performed on the device 10 of FIG. 2. Mask 21 inhibits ion implantation in all masked areas, except for areas underlying opening 19. The ion implantation energy can be chosen so that the implanted ions are implanted in implanted region 25. In one embodiment, the implanted ions cause region 25 to have a increased elastic modulus relative to the elastic modulus of the non-implanted dielectric material 14. In one embodiment, the implanted ions comprise one or more of nitrogen, carbon, or any other appropriate material which increases the elastic modulus of region 25 relative to the elastic modulus of the non-implanted dielectric material 14.

In one embodiment, for ion implant 23, the species concentration of nitrogen is in the range of 1E19 to 5E22 atoms per cubic centimeter. Alternate embodiments may use an implant species concentration of nitrogen in the range of 1E20 to 5E21 atoms per cubic centimeter. If both nitrogen and carbon are used together for ion implant 23, their respective concentrations may remain in these same ranges. If nitrogen is used for ion implant 23, a subsequent anneal process may be used to cause the implanted dielectric in region 25 to form an oxynitride. An anneal may also be used for other materials. For nitrogen, the anneal process may performed at temperatures in the range of 500–1175 degrees Celsius for 10 minutes to 2 hours, or alternately at temperatures in the range of 700–1150 degrees Celsius for 10 minutes to 1 hour. In general, a longer time is required for the anneal process when a lower temperature is used.

Figure 4:
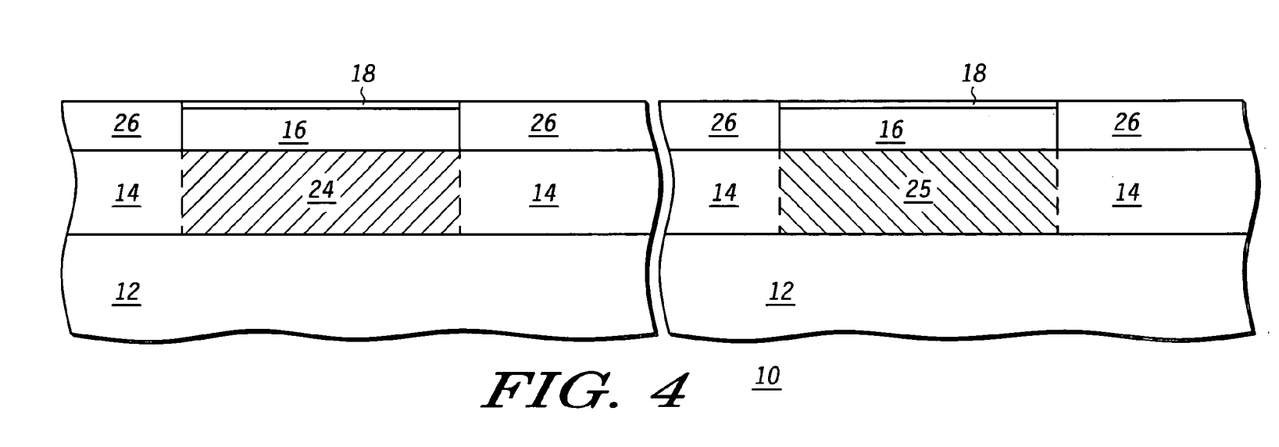

FIG. 4 illustrates the device 10 of FIG. 3 for which masking layer 21 has been removed. In addition, standard processing techniques have been used to etch and refill isolation trenches 26. Note that in one embodiment, trenches 26 are refilled, using one or more steps, with one or more dielectric materials. In one embodiment, the refill material comprises silicon dioxide. Alternate embodiments may use refill material comprising oxynitride and/or silicon nitride.

Figure 5:
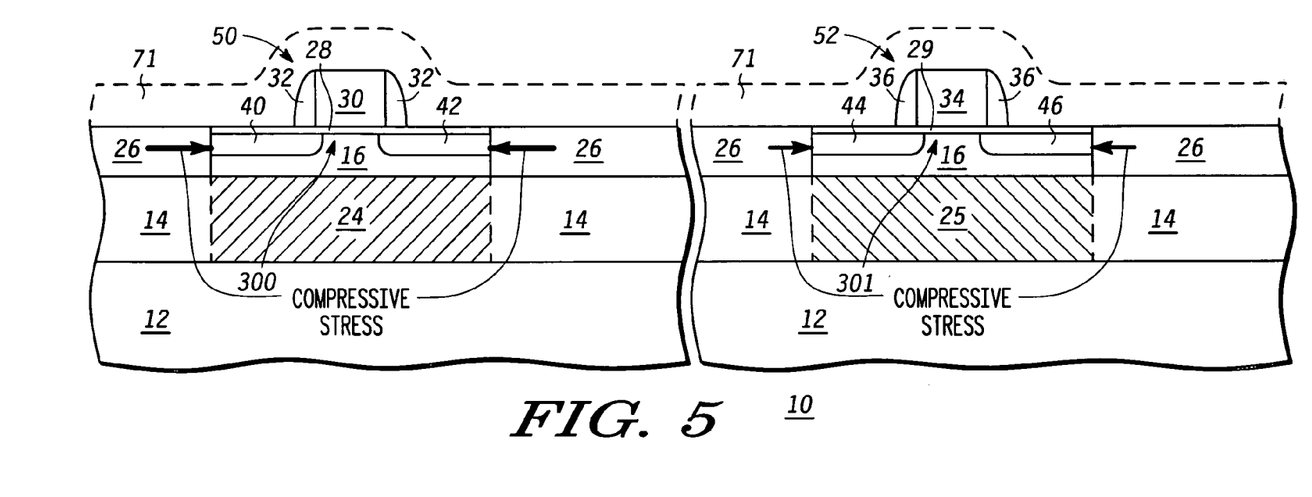

FIG. 5 illustrates the device 10 of FIG. 4 in which p-channel transistor 50 and n-channel transistor 52 are formed using standard processes known in the art. In the illustrated embodiment, p-channel transistor 50 comprises a gate electrode 30, gate spacers 32, source/drain regions 40 and 42, and a gate dielectric 28 which is disposed between layer 16 and gate structure 30, 32. Also in the illustrated embodiment, n-channel transistor 52 comprises a gate electrode 34, gate spacers 36, source/drain regions 44 and 46, and a gate dielectric 29 which is disposed between layer 16 and gate structure 34, 36.

Note that because of the difference in the thermal expansion coefficients between silicon dioxide and crystalline silicon, the isolation trenches 26 (e.g. silicon dioxide) exert a compressive stress on the layer 16 (e.g. mono-crystalline silicon) enclosed within isolation trenches 26. This compressive stress may be beneficial or detrimental for the electrical performance of transistor 50 and 52.

Referring first to p-channel transistor 50, the compressive stress exerted by trenches 26 on the channel region 300 of transistor 50 is increased by decreasing the elastic modulus of underlying implanted region 24. The increased compressive stress in the channel region 300 of p-channel transistor 50 is known to increase the hole mobility of the p-channel transistor 50.

Referring now to n-channel transistor 52, the compressive stress exerted by trenches 26 on the channel region 301 of transistor 52 is decreased by increasing the elastic modulus of underlying implanted region 24. The decreased compressive stress in the channel region 301 of n-channel transistor 52 is known to increase the electron mobility of the n-channel transistor 52. Note that the compressive stress arrows illustrated for the channel region 300 of p-channel transistor 50 are longer than the compressive stress arrows illustrated for the channel region 301 of n-channel transistor 52 in order to represent that there is more compressive stress in the channel region 300 of p-channel transistor 50 than in the channel region 301 of n-channel transistor 52.

Although the illustrated embodiment has been described in the context of compressive stress due to isolation trenches 26, alternate embodiments may have one or more alternate sources of stress, both compressive and tensile. One example of an alternate source of compressive stress is etched source/drain regions (e.g. 40, 42) which are refilled with silicon germanium. The silicon germanium has a larger lattice constant than silicon, and thus exerts a compressive stress on the surrounding mono-crystalline silicon material. Although silicon germanium source/drain refill may be more useful for p-channel transistors (e.g. 50), silicon germanium source/drain refill may also be used for n-channel transistors (e.g. 52) because it has other benefits unrelated to stress (e.g. lower source/drain sheet resistance, lower contact resistance to nickel silicide). Note that if both the p-channel transistor 50 and the n-channel transistor 52 use silicon germanium source/drain refill, then ion implants 22 and 23 can be the same as described above for FIGS. 2 and 3. And, if only the p-channel transistor 50 uses silicon germanium source/drain refill, then ion implants 22 and 23 can be the same as described above for FIGS. 2 and 3.

In an alternate embodiment, silicon carbon may be used in source/drain regions (e.g. 44, 46) instead of silicon germanium for n-channel transistors (e.g. 52). The silicon carbon has a smaller lattice constant than silicon, and thus exerts a tensile stress on the surrounding mono-crystalline silicon material. Although silicon carbon source/drain refill may be more useful for n-channel transistors (e.g. 52), silicon carbon source/drain refill may also be used for p-channel transistors (e.g. 50) because it has other benefits unrelated to stress (e.g. simplified manufacturing process flow). Note that if both the p-channel transistor 50 and the n-channel transistor 52 use silicon carbon source/drain refill, then ion implant 22 (see FIG. 2) will use the implant species described above for ion implant 23 (e.g. nitrogen), and ion implant 23 (see FIG. 3) will use the implant species described above for ion implant 22 (e.g. boron and phosphorus). However, if only the n-channel transistor 52 uses silicon carbon source/drain refill, then both ion implants 22 and 23 (see FIGS. 2 and 3) will use the implant species described above for ion implant 22 (e.g. boron and phosphorus).

In an alternate embodiment, it may be desirable to reverse the ions which are implanted in ion implants 22 and 23 (see FIGS. 2 and 3). For example, if both transistors 50 and 52 use tensile stressed silicon nitride for an optional passivation layer 71 overlying the source, drain, and gate regions (40, 42, 44, 46, 30, 32, 34, 36), then using the implant species described above for ion implant 22 (e.g. boron and phosphorus) would be desirable for the n-channel transistor 52, and using the implant species described above for ion implant 23 (e.g. nitrogen) would be desirable for the p-channel transistor 50.

In an alternate embodiment, both transistors 50 and 52 use compressive stressed silicon nitride for an optional passivation layer 71 overlying the source, drain, and gate regions (40, 42, 44, 46, 30, 32, 34, 36). For this case, using the implant species described above for ion implant 22 (e.g. boron and phosphorus) would be desirable for the p-channel transistor 50, and using implant species described above for ion implant 23 (nitrogen) would be desirable for the n-channel transistor 52.

Note that the compressive stresses illustrated by the arrows in FIG. 5 are in the lateral direction which is along the channel length. For stresses in the transversal direction which is along the channel width, the above described techniques may be used to control stresses in the transversal direction. For example, in some embodiments, both p-channel transistor 50 and n-channel transistor 52 may have enhanced performance if the stress in the transversal direction is tensile stress. To reduce the compressive stress (or increase the tensile stress) in the transverse direction in the channel region for both p-channel transistor 50 and n-channel transistor 52, it may be desirable to use the implant species described above for ion implant 23 (e.g. nitrogen) for both ion implants 22 and 23 (see FIGS. 2 and 3).

In alternate embodiment, regions 24 and 25 (see FIGS. 3–5) may be directly adjacent with no intervening material (e.g. 14) between them. Some processes used to form device 10 do not require a dielectric area 14 between implant region 24 and implant region 25. Note that if only one implant species is required, then only one implant step 22 or 23 is required. Note also that different embodiments use different mask configurations in one or more of ion implant steps 22, 23 to implant the desired regions for the purpose of affecting and thus controlling the stress (compressive or tensile) in the channel region of one or more semiconductor devices. Alternate embodiments may use the above described technique for the purpose of affecting and thus controlling the stress (compressive or tensile) in other regions of an integrated circuit.

Figure 6:
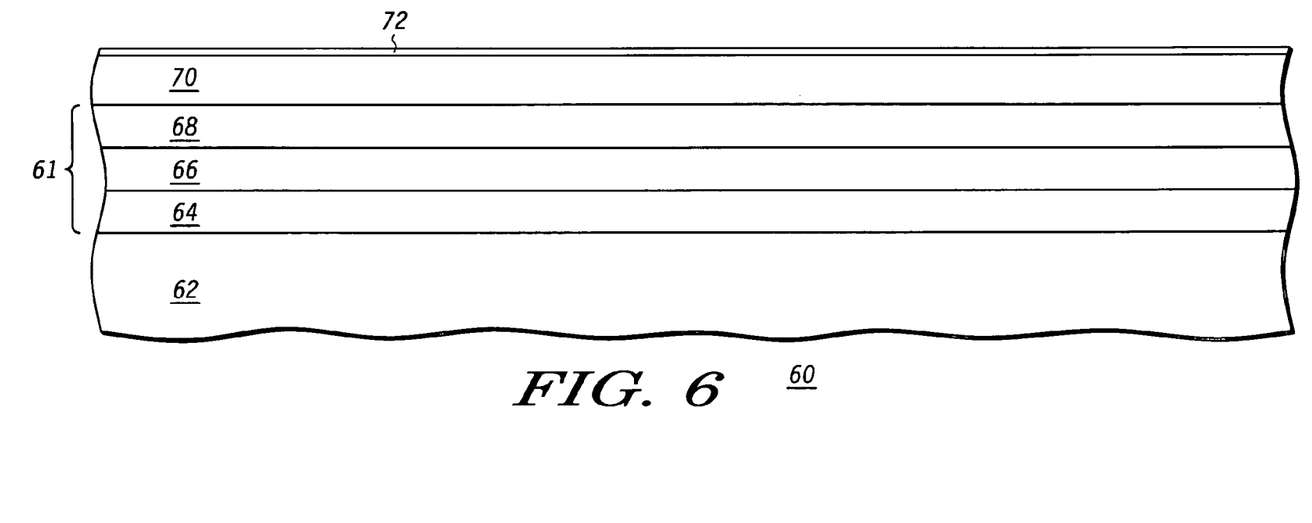
FIGS. 6–10 of the drawings illustrate a series of partial cross-sectional views of a semiconductor device during various stages of manufacture of an integrated circuit according to an alternate embodiment of the present invention.

FIG. 6 illustrates a semiconductor device 60 having a substrate 62, an overlying buried layer 61 comprising a plurality of discrete layers 64, 66, and 68, an overlying mono-crystalline semiconductor layer 70, and an overlying dielectric layer 72. In one embodiment, substrate 62 comprises one or more of mono-crystalline silicon, sapphire, silicon oxide, polysilicon, or any appropriate material with sufficient structural strength to support the overlying layers. In one embodiment, buried layer 61 comprises discrete lateral layers 64 and 68 which are comprises of one or more dielectric materials, such as, for example, silicon dioxide, silicon nitride, silicon oxynitride, or any appropriate dielectric material. Note that layers 64 and 68 may be formed using the same or different materials. Dielectric layer 64 is in contact with substrate 62, and dielectric layer 68 is in contact with mono-crystalline semiconductor layer 70. Note that layer 70 is the active layer in which semiconductor devices are intended to be formed (see FIG. 10).

In one embodiment, mono-crystalline semiconductor layer 70 comprises one or more of silicon, silicon germanium, silicon carbon, silicon germanium carbon, in various states of mechanical stress. In one embodiment, dielectric layer 72 comprises one or more of silicon dioxide, silicon nitride, silicon oxynitride, hafnium oxide, zirconium oxide, hafnium zirconium oxide, or any appropriate dielectric material having a high dielectric constant (K). In some embodiments, dielectric layer 18 may be a sacrificial layer which is removed during further processing. In one embodiment, layer 66 comprises a dielectric material such as, for example, silicon dioxide, silicon nitride, silicon oxynitride, or any appropriate dielectric material that is different from layers 64 and 68. In an alternate embodiment, layer 66 may be comprises of one or more semiconductor materials, such as, for example, poly-crystalline silicon (either doped or undoped). Alternatively, layer 66 may be comprised of one or more conductive materials, such as, for example, silicides, metal carbides, or metal nitrides.

Figure 7:
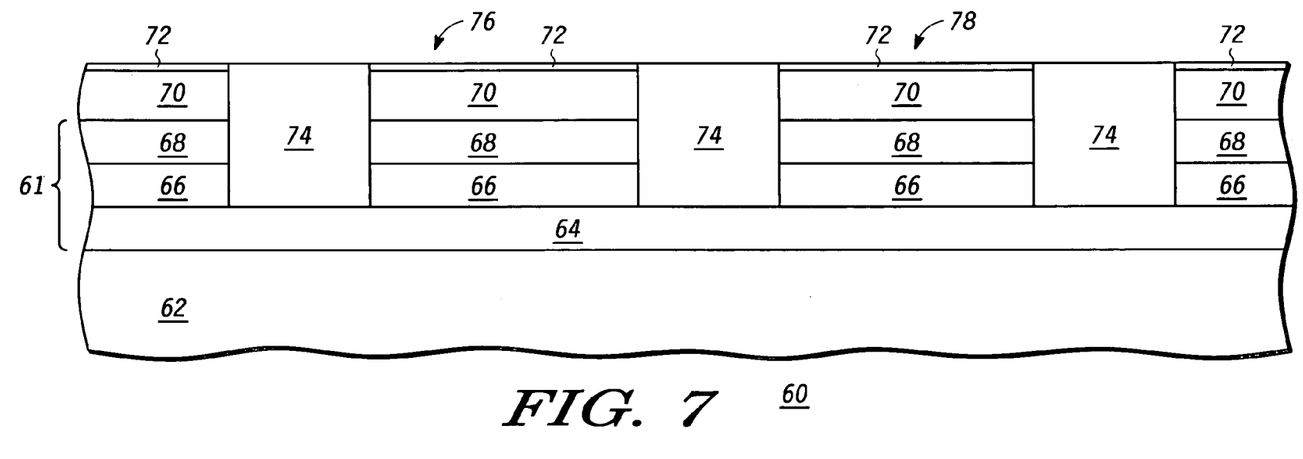

FIG. 7 illustrates the device 60 of FIG. 6 for which an opening (area 74) is etched into layers 70, 68, 66, and stops at etch stop layer 64. Then the opening (area 74) is refilled to form isolation trenches 74. Note that in one embodiment, trenches 74 are refilled, using one or more steps, with one or more dielectric materials. In one embodiment, the refill material comprises silicon dioxide. Alternate embodiments may use refill material comprising oxynitride and/or silicon nitride.

Figure 8:
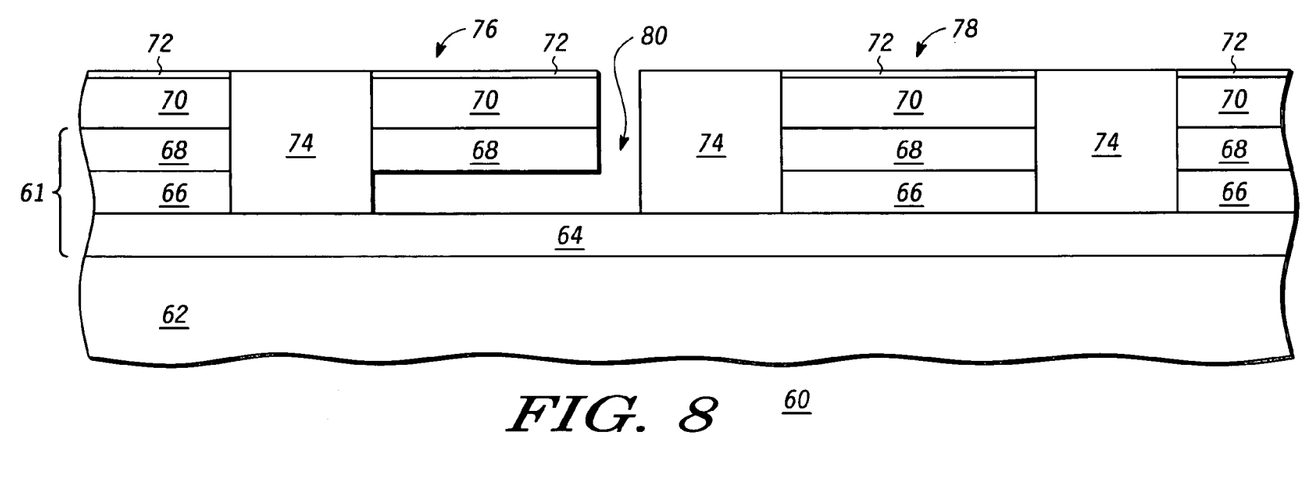

FIG. 8 illustrates the device 60 of FIG. 7 for which an opening 80 is formed into selected portions of layers 70 and 68 to provide access to layers 66 so that selected portion of layer 66 may be removed. In the illustrated embodiment, the portion of layer 66 between trenches 74 in the area 76 is selectively removed. Thus the removed portion of layer 66 becomes part of the cavity 80. The removal of selected portions of layer 66 may be effected by any appropriate removal process, such as, for example, a wet chemical etch, remote plasma etch, etc. Note that for alternate embodiments, there may be one or more openings 80 in area 76. Note that in the illustrated embodiment, no openings 80 are formed in area 78.

Figure 9:
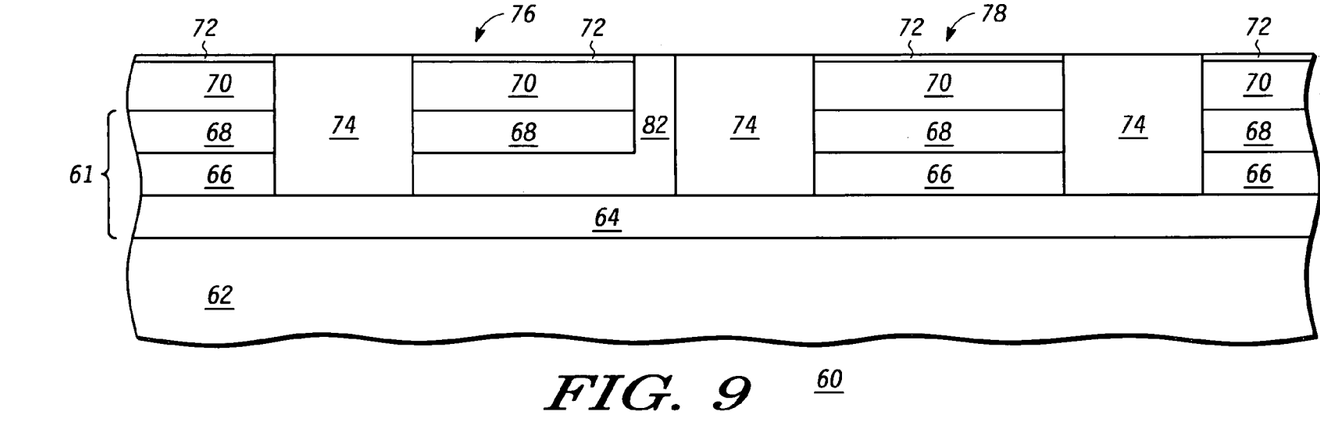

FIG. 9 illustrates the device 60 of FIG. 8 for which the opening 80 is refilled with a material 82 different than the original material 66. In one embodiment, material 82 comprises one or more of BPSG, oxide (deposited in any desired manner), conductive materials such as doped polysilicon or polysilicon germanium, or other appropriate materials. Note that this layer 82 may be used for local buried interconnect, or alternately as a back gate electrode for a transistor (e.g. see transistor 104 is FIG. 10). If material 82 is a conductor, it may be necessary for material 82 to be isolated from the exposed sidewall of semiconductor region 70. In one embodiment, this can be accomplished by oxidizing the sidewall of the region 70 in the opening 80 prior to the deposition of material 82. This oxidation step may interpose an isolation layer (not shown) between region 70 and material 82. Alternate embodiments may isolate a conductive material 82 in a different manner or using different materials.

Figure 10:
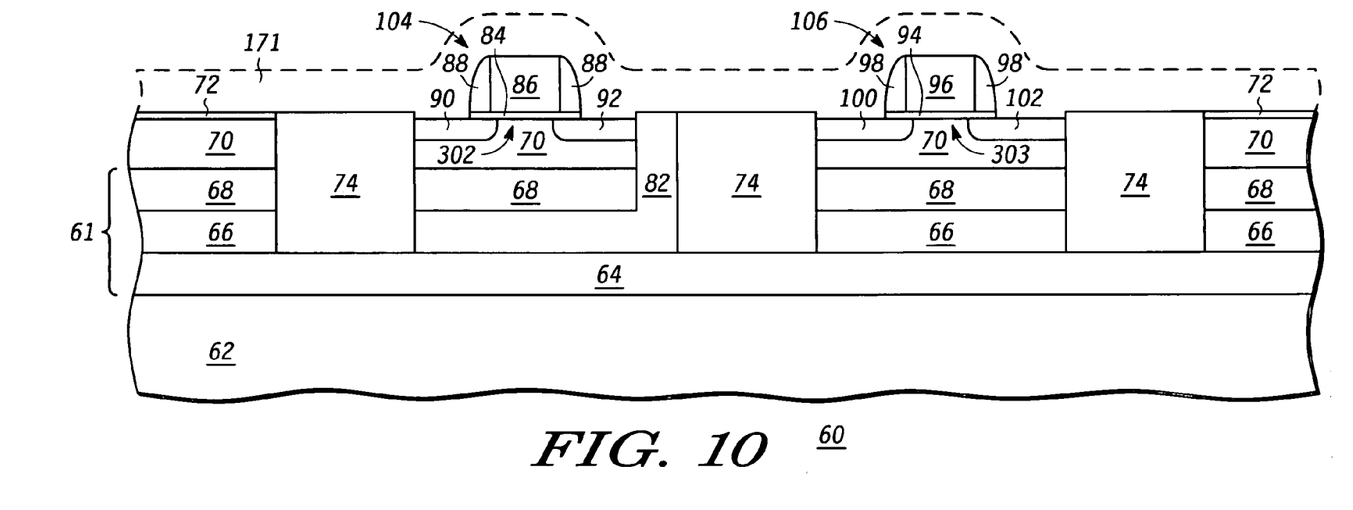

FIG. 10 illustrates the device 60 of FIG. 9 in which p-channel transistor 104 and n-channel transistor 106 are formed using standard processes known in the art. In the illustrated embodiment, p-channel transistor 104 comprises a gate electrode 86, gate spacers 88, source/drain regions 90 and 92, and a gate dielectric 84 which is disposed between layer 70 and gate structure 86, 88. Also in the illustrated embodiment, n-channel transistor 106 comprises a gate electrode 96, gate spacers 98, source/drain regions 100 and 102, and a gate dielectric 94 which is disposed between layer 70 and gate structure 96, 98. Note that transistor 104 may use material 82 as a second independent gate electrode (i.e. bottom electrode), if desired.

Note that because of the difference in the thermal expansion coefficients between silicon dioxide and crystalline silicon, the isolation trenches 74 (e.g. silicon dioxide) exert a compressive stress on the layer 70 (e.g. mono-crystalline silicon) enclosed within isolation trenches 74. This compressive stress may be beneficial or detrimental for the electrical performance of transistor 104 and 106. Note that the behavior of p-channel transistor 104 may be comparable to the behavior of p-channel transistor 50, and similarly the behavior of n-channel transistor 106 may be comparable to the behavior of n-channel transistor 52 (see FIGS. 5 and 10).

Referring first to p-channel transistor 104, in one embodiment, the compressive stress exerted by trenches 74 on the channel region 302 of transistor 104 is increased by decreasing the elastic modulus of the underlying material by replacing material 66 with material 82, wherein material 82 has a lower elastic modulus than material 66. The increased compressive stress in the channel region of p-channel transistor 104 is known to increase the hole mobility of the p-channel transistor 104.

Referring now to n-channel transistor 106, in the illustrated embodiment, no opening 80 has been formed adjacent to transistor 106. Thus, it is not possible to replace material 66 underlying transistor 106 with a material having a different elastic modulus than material 66. However, note that for embodiments which use a material for layer 66 which already has a high elastic modulus (e.g. silicon nitride), the compressive stress in the channel region 303 of transistor 106 may already be appropriately reduced. The decreased compressive stress in the channel region 303 of n-channel transistor 106 is known to increase the electron mobility of the n-channel transistor 106.

Although the illustrated embodiment has been described in the context of compressive stress due to isolation trenches 74, alternate embodiments may have one or more alternate sources of stress, both compressive and tensile. One example of an alternate source of compressive stress is etched source/drain regions (e.g. 90, 92) which are refilled with silicon germanium. The silicon germanium has a larger lattice constant than silicon, and thus exerts a compressive stress on the surrounding mono-crystalline silicon material. Although silicon germanium source/drain refill may be more useful for p-channel transistors (e.g. 104), silicon germanium source/drain refill may also be used for n-channel transistors (e.g. 106) because it has other benefits unrelated to stress (e.g. lower source/drain sheet resistance, lower contact resistance to nickel silicide). Note that if both the p-channel transistor 104 and the n-channel transistor 106 use silicon germanium source/drain refill, then material 82 may be a material (e.g. BPSG) having a lower elastic modulus than material 66, and material 66 may be a material already having a high elastic modulus. And, if only the p-channel transistor 104 uses silicon germanium source/drain refill, then no changes are required (i.e. material 82 may be a material (e.g. BPSG) having a lower elastic modulus than material 66, and material 66 may be a material already having a high elastic modulus).

In an alternate embodiment, silicon carbon may be used in source/drain regions (e.g. 100, 102) instead of silicon germanium for n-channel transistors (e.g. 106). The silicon carbon has a smaller lattice constant than silicon, and thus exerts a tensile stress on the surrounding mono-crystalline silicon material. Although silicon carbon source/drain refill may be more useful for n-channel transistors (e.g. 106), silicon carbon source/drain refill may also be used for p-channel transistors (e.g. 104) because it has other benefits unrelated to stress (e.g. simplified manufacturing process flow). Note that if both the p-channel transistor 106 and the n-channel transistor 104 use silicon carbon source/drain refill, then an opening 80 can be made adjacent to transistor 106 rather than adjacent to transistor 104 so that material 66 underlying n-channel transistor 106 can be replaced with a material having a lower elastic modulus than material 66, and material 66 underlying p-channel transistor 104 will not be affected.

Note that opening 80 may be made adjacent to any transistor (e.g. 104) in order to replace the material (e.g. 66) underlying the active region with any desired material. Although the embodiments described above have replaced a material underlying the active region for purposes of reducing mechanical stress, alternate embodiments may replace one or more selected materials underlying the active area for any desired purpose. One such purpose may be for electromagnetic shielding. Many other purposes are possible. Note also, that the above described techniques may be used to replace any one or more materials underlying active region 70. For example, layer 68 may be removed and replaced with a conductive material, thus providing a contact to layer 70 of the transistor (e.g. 104). Alternately, layer 64 may be removed and replaced with a conductive material to provide a contact to the substrate 62.

In an alternate embodiment, both transistors 104 and 106 use compressive stressed silicon nitride for an optional passivation layer 171 overlying the source, drain, and gate regions (90, 92, 100, 102, 86, 88, 96, 98). Note that the compressive stresses in the channel region described above for FIG. 10 are in the lateral direction which is along the channel length. For stresses in the transversal direction which is along the channel width, the above described techniques may be used to control stresses in the transversal direction. For example, in some embodiments, both p-channel transistor 104 and n-channel transistor 106 may have enhanced performance if the stress in the transversal direction is tensile stress. To reduce the compressive stress (or increase the tensile stress) in the transverse direction in the channel region for both p-channel transistor 104 and n-channel transistor 106, it may be desirable to leave material 66 underlying both transistors 104 and 106.

Note also that different embodiments may use different materials for layer 66 for the purpose of affecting and thus controlling the stress (compressive or tensile) in the channel region of one or more semiconductor devices. Alternate embodiments may use the above described technique for the purpose of affecting and thus controlling the stress (compressive or tensile) in other regions of an integrated circuit.

Although buried dielectric 61 was illustrated as having three discrete layers, alternate embodiments may have any number of layers.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for controlling stress in a semiconductor device comprising:

providing a substrate;

forming a dielectric layer overlying the substrate and in contact with the substrate, the dielectric layer comprising a first region having a first elastic modulus and a second region having a second elastic modulus that differs from the first elastic modulus;

forming a semiconductor layer overlying and in contact with the dielectric layer;

forming an active device having a portion that is formed within the semiconductor layer and overlying the first region of the dielectric layer, wherein the first elastic modulus has a value to optimize stress in an element of the active device.

2. The method of claim 1 further comprising:

forming the active device as a first transistor of a first conductivity type;

forming a second transistor of a second conductivity type opposite the first conductivity type and overlying a third region of the dielectric layer, the third region of the dielectric layer having a third elastic modulus substantially equal to the first elastic modulus;

implanting the first region of the dielectric layer and the third region of the dielectric layer to increase the first elastic modulus and the third elastic modulus to reduce compressive stress or increase tensile stress of channel regions of both the first transistor and the second transistor.

3. The method of claim 1 wherein forming the first region of the dielectric layer further comprises:
   delineating the first region of the dielectric layer by masking the semiconductor device to expose the first region;
   implanting a predetermined amount of at least one of boron, phosphorous or nitrogen or a combination of boron and phosphorous into the semiconductor device to modify the first elastic modulus and thereby either reduce compressive stress or increase tensile stress in the active device.

4. The method of claim 3 further comprising:
   delineating the second region of the dielectric layer by masking the semiconductor device to expose the second region; and
   implanting a predetermined amount of at least one of boron, phosphorous or nitrogen or a combination of boron and phosphorous into the semiconductor device to modify the second elastic modulus and thereby either reduce compressive stress or increase tensile stress in a second active device overlying the second region.

5. The method of claim 4 further comprising:
   forming the active device as a P-channel transistor and forming the second active device as an N-channel transistor; and
   separating the P-channel transistor from the N-channel transistor by a third region comprising a third elastic modulus that differs from the first elastic modulus and the second elastic modulus.

6. The method of claim 4 further comprising:
   optimizing stress in a channel of the second active device by increasing tensile stress in the channel of the second active device.

7. The method of claim 1 further comprising:
   optimizing stress in the element of the active device by increasing compressive stress in the element of the active device.

8. A method for regional control of stress in a semiconductor device comprising:
   providing a substrate;
   forming a buried oxide layer overlying the substrate;
   forming a semiconductor layer overlying the buried oxide layer;
   masking the semiconductor device to delineate a first region of the buried oxide layer;
   implanting the semiconductor device with one of a boron implant species, a phosphorous implant species or a boron/phosphorous implant species to modify an elastic modulus of the first region of the buried oxide layer;
   masking the semiconductor device to delineate a second region of the buried oxide layer;
   implanting the semiconductor device with a nitrogen implant species to modify an elastic modulus of the second region of the buried oxide layer;
   forming shallow trench isolation regions around portions of the semiconductor layer overlying the first region of the buried oxide layer and the second region of the buried oxide layer; and
   forming first and second transistors respectively overlying the first region of the buried oxide layer and the second region of the buried oxide layer, the first region of the buried oxide layer and the second region of the buried oxide layer comprising different elastic moduli to optimize stress in each of the first and second transistors.

9. The method of claim 8 further comprising:
   separating the first region of the buried oxide layer from the second region of the buried oxide layer by a third region of the buried oxide layer underlying the shallow trench isolation regions, the third region of the buried oxide layer not having an elastic constant thereof modified by implanting the semiconductor device.

10. The method of claim 8 wherein implanting the semiconductor device with the boron implant species, a phosphorous implant species or a boron/phosphorous implant species further comprises annealing the semiconductor device to respectively form BSG (boron silicate glass), PSG (phosphorous silicate glass) or BPSG (boron phosphorous silicate glass) having a lower elastic modulus than prior to the implanting.

11. The method of claim 10 wherein the lower elastic modulus is determined in part by specifying concentration of implant species.

12. The method of claim 8 wherein implanting the semiconductor device with the nitrogen implant species further comprises annealing the semiconductor device to form silicon oxynitride ($SiO_xN_y$) having a larger elastic modulus than prior to the implanting.

13. The method of claim 12 wherein the larger elastic modulus is determined in part by specifying concentration of the nitrogen implant species.

14. A method for forming a first semiconductor device and a second semiconductor device, the method comprising:
   forming a buried oxide layer overlying a substrate;
   forming a semiconductor layer overlying the buried oxide layer;
   implanting a first region of the buried oxide layer with a first implant species to modify an elastic modulus of the first region of the buried oxide layer;
   implanting a second region of the buried oxide layer with a second implant species to modify an elastic modulus of the second region of the buried oxide layer;
   forming isolation regions around portions of the semiconductor layer overlying the first region of the buried oxide layer and the second region of the buried oxide layer;
   forming the first semiconductor device overlying the first region of the buried oxide layer; and
   forming the second semiconductor device overlying the second region of the buried oxide layer.

15. A method as in claim 14, wherein the first implant species comprises at least one of a group consisting of nitrogen and carbon.

16. A method as in claim 15, wherein the second implant species comprises at least one of a group consisting of boron and phosphorus.

17. The method of claim 14 wherein a concentration of the first implant species is in a range of 1E19 to 5E22 atoms per cubic centimeter.

18. The method of claim 17 wherein a concentration of the second implant species is in a range of 1E19 to 5E22 atoms per cubic centimeter.

* * * * *